(12) United States Patent
Nguyen et al.

(10) Patent No.: US 6,319,324 B1
(45) Date of Patent: Nov. 20, 2001

(54) METHOD AND APPARATUS FOR ELIMINATION OF TEOS/OZONE SILICON OXIDE SURFACE SENSITIVITY

(75) Inventors: Bang C. Nguyen, Fremont; Shankar Vankataranan, Santa Clara; Ruby Liao, Sunnyvale; Peter W. Lee, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/662,248

(22) Filed: Sep. 14, 2000

Related U.S. Application Data

(62) Division of application No. 08/851,830, filed on May 5, 1997, now Pat. No. 6,149,974.

(51) Int. Cl.$^7$ .................................................. C23C 16/00
(52) U.S. Cl. ...................... 118/697; 118/704; 118/715; 118/725
(58) Field of Search .................... 118/697, 704, 118/715, 725

(56) References Cited

U.S. PATENT DOCUMENTS 4,260,647   4/1981  Wang et al. ........................ 427/40
4,872,947  10/1989  Wang et al. ........................ 156/643

(List continued on next page.)

FOREIGN PATENT DOCUMENTS 0 421 203 A1   4/1991  (EP) ............................ H01L/21/316

OTHER PUBLICATIONS

Chanana, R.K., et al., "Effect of Annealing and Plasma Precleaning on the Electrical Properties of $N_2O/SiH_4$ PECVD Oxide as Gate Material in MOSFETs and CCDs," *Solid–State Electronics* (Jul. 1993) vol. 36, No. (7):1021–1026.

(List continued on next page.)

*Primary Examiner*—Richard Bueker
(74) *Attorney, Agent, or Firm*—Townsend and Townsend and Crew

(57) ABSTRACT

A method and apparatus for reducing surface sensitivity of a TEOS/$O_3$ SACVD silicon oxide layer, formed over a substrate, that deposits a ramp layer while ramping pressure to a target deposition pressure and deposits an SACVD layer over the ramp layer. In one embodiment, the flow of ozone is stopped during the pressure ramp-up to control the thickness of the ramp layer.

14 Claims, 10 Drawing Sheets

U.S. PATENT DOCUMENTS

| | | | |
|---|---|---|---|
| 4,892,753 | 1/1990 | Wang et al. | 427/38 |
| 4,956,312 | 9/1990 | Van Laarhoven | 437/180 |
| 4,987,005 | 1/1991 | Suzuki et al. | 427/39 |
| 5,000,113 | 3/1991 | Wang et al. | 118/723 |
| 5,040,046 | 8/1991 | Chhabra et al. | 357/54 |
| 5,098,865 | 3/1992 | Machado et al. | 437/238 |
| 5,120,680 | 6/1992 | Foo et al. | 437/238 |
| 5,158,644 | 10/1992 | Cheung et al. | 156/643 |
| 5,210,801 | 5/1993 | Fournier et al. | 385/14 |
| 5,271,972 | 12/1993 | Kwok et al. | 427/579 |
| 5,286,518 | 2/1994 | Cain et al. | 427/96 |
| 5,319,247 | 6/1994 | Matsuura | 257/760 |
| 5,332,694 | 7/1994 | Suzuki | 437/195 |
| 5,354,715 | 10/1994 | Wang et al. | 437/238 |
| 5,356,722 | 10/1994 | Nguyen et al. | 427/569 |
| 5,362,526 | 11/1994 | Wang et al. | 427/573 |
| 5,393,708 | 2/1995 | Hsia et al. | 437/228 |
| 5,399,389 | 3/1995 | Hieber et al. | 427/579 |
| 5,403,630 | 4/1995 | Matsui et al. | 427/583 |
| 5,413,967 | 5/1995 | Matsuda et al. | 437/235 |
| 5,426,076 | 6/1995 | Moghadam | 437/238 |
| 5,429,995 | 7/1995 | Nishiyama et al. | 437/238 |
| 5,502,006 | 3/1996 | Kasagi | 437/195 |

OTHER PUBLICATIONS

Fujino, K., et al., "Dependence of Deposition Rate on Base Materials in TEOS/$O_3$ AP CVD," *VMIC Conference–Jun. 12–13*, (Jun. 1990) pp.:187–193.

Fujino, K., et al., "Dependence of Deposition Characteristics on Base Materials in TEOS and Ozone CVD at Atmospheric Pressure," *J. Electrochemical Society*, (Feb. 1991) vol. 138, No. (2):550–554.

Kwok, K., et al., "Surface Related Phenomena in Integrated PECVD/Ozone–TEOS SACVD Processes for Sub–Half Micron Gap Fill: Electrostatic Effects," *J. Electrochemical Society* (Aug. 1994) vol. 141, No. (8):2172–2177.

Matsuura, et al., "Substrate–Dependent Characteristics of APCVD Oxide Using TEOS and Ozone," *Extended Abstracts of the 22$^{nd}$ International Solid State Devices and Materials–Sendai, Hotel Sendai Plaza* (Aug. 22–24, 1990) pp.:239–242.

McInerney, et al., "A Planarized $SiO_2$ Interlayer Dielectric With Bias–CVD," *IEEE Transactions on Electron Devices*, (Mar. 1987) vol. ED–34, No. (3):615–619.

METHOD AND APPARATUS FOR ELIMINATION OF TEOS/OZONE SILICON OXIDE SURFACE SENSITIVITY

This application is a divisional application and claims the benefit of U.S. patent application Ser. No. 08/851,830, filed May 5, 1997, now U.S. Pat. No. 6,149,974, the entire disclosure of which is incorporated herein by reference.

BACKGROUND OF THE INVENTION

The present invention relates to the fabrication of integrated circuits. More particularly, the invention provides a technique, including a method and apparatus, for reducing the surface sensitivity of a sub-atmospheric chemical vapor deposition (herein SACVD) deposited silicon oxide (also referred to as SACVD undoped silicon glass (USG)) film utilized in the manufacture of integrated circuits.

One of the primary steps in the fabrication of modern semiconductor devices is the formation of a thin film on a semiconductor substrate by chemical reaction of gases. Such a deposition process is referred to as chemical vapor deposition, or "CVD." Conventional thermal CVD processes supply reactive gases to the substrate surface where heat-induced chemical reactions take place to produce a desired film. The high temperatures at which some thermal CVD processes operate can damage device structures having metal layers.

One particular thermal CVD process that has been developed to deposit insulation films over metal layers at relatively low, nondamaging temperatures includes deposition of a silicon oxide layer from tetraethylorthosilane (herein TEOS) and ozone precursor gases. Such a TEOS/ozone silicon oxide film may be deposited under carefully controlled pressure conditions in the range of between about 100–700 torr, and is therefore commonly referred to as a subatmospheric CVD (SACVD) film. The high reactivity of TEOS with ozone reduces the external energy required for a chemical reaction to take place, and thus lowers the required temperature for such SACVD processes.

Another CVD method of depositing silicon oxide layers over metal layers at relatively low temperatures includes plasma-enhanced CVD (herein PECVD) techniques. Plasma-enhanced CVD techniques promote excitation and/or disassociation of the reactant gases by the application of radio frequency (RF) energy to a reaction zone proximate the substrate surface, thereby creating a plasma of highly reactive species. The high reactivity of the released species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two-year/half-size rule (often called "Moore's Law"), which means that the number of devices which will fit on a chip doubles every two years. Today's wafer fabrication plants are routinely producing 0.5 and even 0.35 micron feature size devices, and tomorrow's plants soon will be producing devices having even smaller geometries.

As device sizes become smaller and integration density increases, one issue that has become increasingly important is the capability of a deposited insulating silicon oxide layer to fill closely spaced gaps (referred to as a film's "gap fill" capability) such as those between adjacent metal lines.

The properties of the SACVD layer depend strongly on the underlying surface onto which it is deposited. When the SACVD layer is deposited over a silicon oxide layer, such as the steam oxide or PECVD lining layer, or on the surface of a metal, the quality of the SACVD layer generally deteriorates because of surface sensitivity to the underlying layer. The quality of a CVD silicon oxide layer is not as good as the quality of "steam oxide" grown on the surface of a silicon substrate by heating the substrate in the presence of steam. The surface sensitivity of the SACVD layer is manifested by an increase in the wet etch rate compared to the wet etch rate of thermally grown steam oxide, and by a decrease in the deposition rate and a rougher surface morphology as compared to the deposition rate and surface morphology of an SACVD layer deposited directly on a silicon substrate.

The wet etch rate ratio (herein WERR) is the ratio of the wet etch rate of an SACVD layer deposited over the PECVD lining layer to the wet etch rate of a thermally grown steam oxide. The CVD layer is typically more porous than a steam layer and tends to etch away more quickly than the steam oxide. The deposition rate ratio (DRR) is the ratio of the deposition rate of the SACVD layer deposited over the PECVD lining layer to the deposition rate of an SACVD layer deposited directly on a bare silicon substrate. Thus, surface sensitivity is manifested by a high WERR and a low DRR. Surface sensitivity is also referred to as the "base layer effect" because the deterioration of quality of the SACVD layer depends on the properties of the base layer over which it is deposited.

One process that has been used successfully to fill gaps up to an aspect ratio of 2.0 or higher and reduce the surface sensitivity of an SACVD layer is the deposition of a two-layer silicon oxide dielectric film. First, a thin PECVD silicon oxide layer ("the PECVD lining layer") is deposited over stepped topography (such as adjacent metal lines) of a substrate. Second, an SACVD TEOS/ozone silicon oxide layer ("the SACVD layer") is deposited. The PECVD lining layer functions as an initial lining layer and diffusion barrier for the overlying SACVD layer. The lining layer is typically of lower quality than the SACVD layer, but its presence lowers the surface sensitivity of the overlying SACVD layer that fills in the gaps between the metal lines. The entire deposition sequence takes place in an in situ process.

Various techniques have been utilized to reduce the sensitivity of the SACVD layer of a two-layer silicon oxide gap-filling film. One method, developed at Applied Materials, Inc., is to treat the PECVD lining layer with an $N_2$ plasma, excited by mixed RF frequencies (13.56 MHz and 350 KHz), at a relatively high pressure ($\geq 1.5$ torr) prior to deposition of the SACVD layer.

Another technique utilized to reduce the surface sensitivity of an SACVD silicon oxide layer is to deposit the layer over a lining silicon oxide layer formed using TEOS and ozone as process gases at low pressure and high ozone concentration.

SUMMARY OF THE INVENTION

The present invention addresses the above needs by providing a method and apparatus for reducing surface sensitivity of an SACVD silicon oxide layer to an underlying substrate.

According to one aspect of the invention, a first process gas including TEOS and $O_3$ is introduced into the chamber and the pressure is ramped from a base pressure to about 450 torr to form a ramp-up lining layer. Subsequent to the formation of the ramp-up layer, deposition process gases including TEOS and $O_3$ are introduced into the chamber at subatmospheric pressure and thermal energy is supplied to deposit an SACVD silicon oxide layer over the ramp-up layer.

According to another aspect of the invention, the flow of ozone is stopped during the pressure ramp-up to stop the deposition of the ramp-up layer at a desired thickness.

According to a further aspect of the invention, the flow rates of the process gases are varied to change the effect of the ramp-up layer on the surface sensitivity of the SACVD layer deposited thereover.

According to a further aspect of the invention, the ramp-up rate of deposition pressure during the formation of the ramp-up layer is varied to change the effect of the ramp-up layer on the surface sensitivity of the SACVD layer deposited thereover.

For a further understanding of the objects and advantages of the present invention, reference should be made to the following detailed description taken in conjunction with the accompanying drawings.

DETAILED DESCRIPTION OF THE PREFERRED EMBODIMENT

I. Exemplary CVD System

In the preferred embodiments of the invention a thermal CVD process is utilized to deposit an oxide layer having reduced surface sensitivity. The preferred embodiment could be performed in a thermal CVD chamber. However, this oxide layer may be deposited over PECVD layers. Accordingly, a chamber is described that performs both thermal and plasma-enhanced CVD processes. During a thermal process the RF power is set to 0.

Figure 1A:
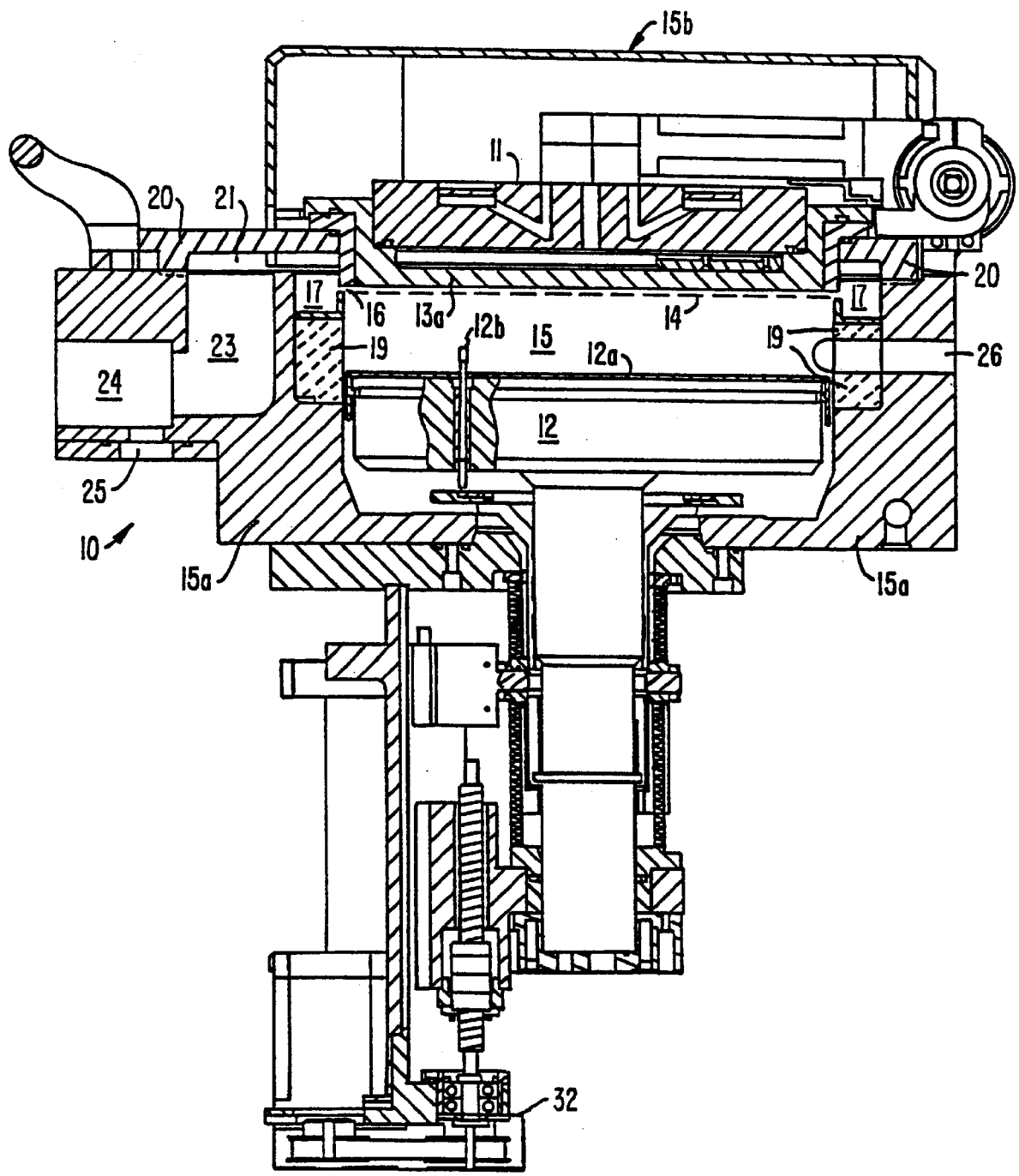
FIGS. 1A and 1B are vertical, cross-sectional views of one embodiment of a chemical vapor deposition apparatus according to the present invention.
Figure 1B:
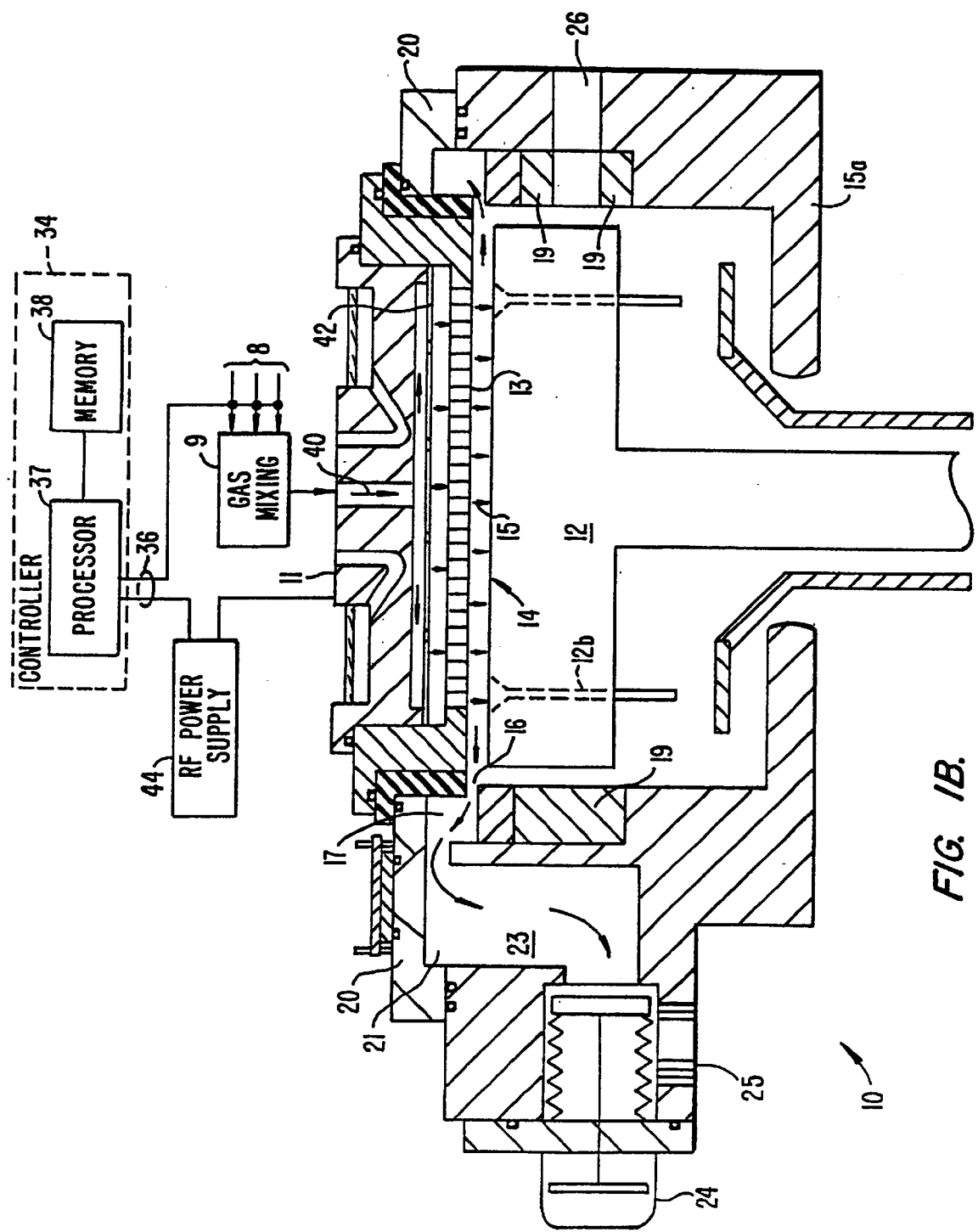
Figure 1C:
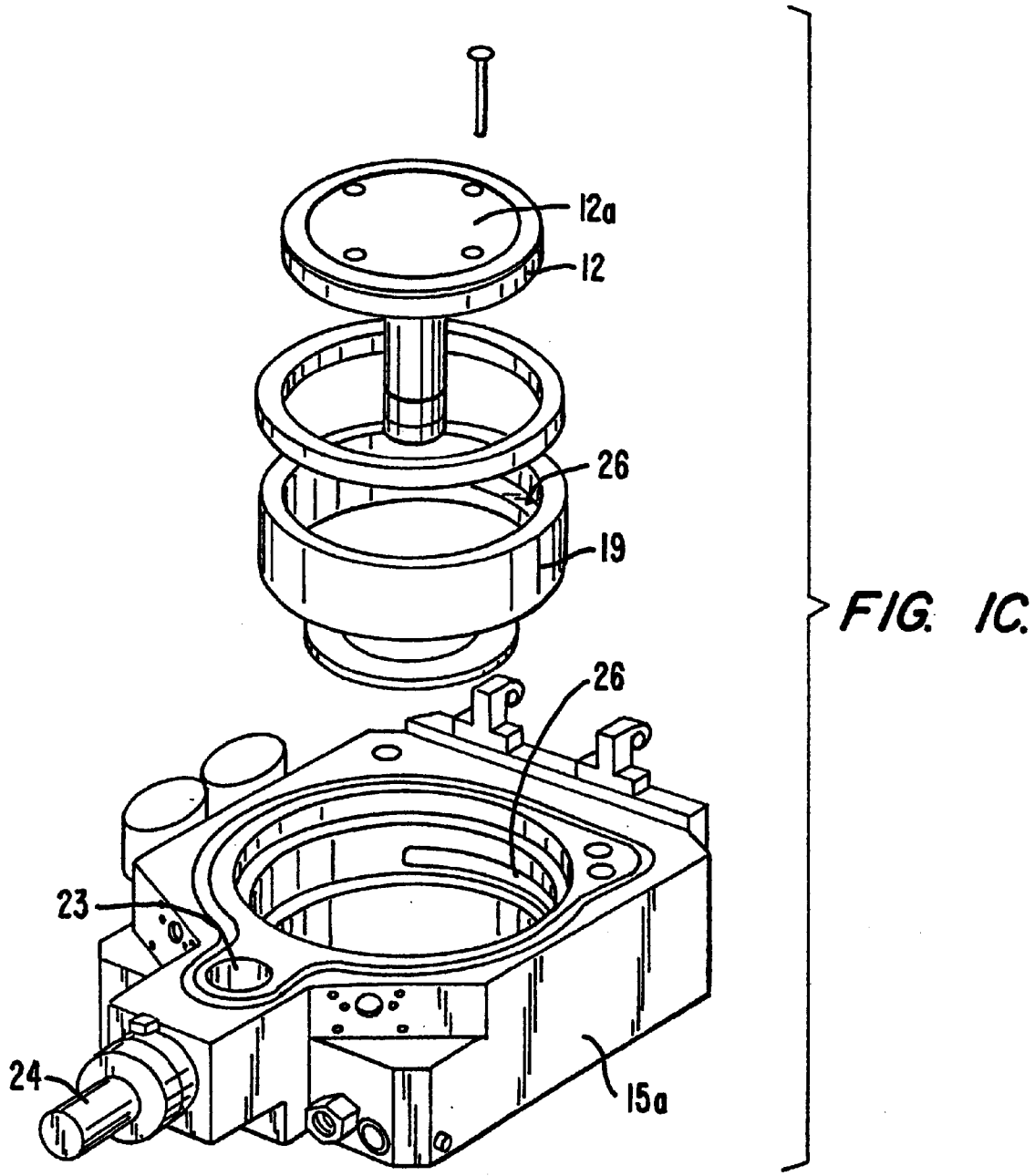
FIGS. 1C and 1D are exploded perspective views of parts of the CVD chamber depicted in FIG. 1A.
Figure 1D:
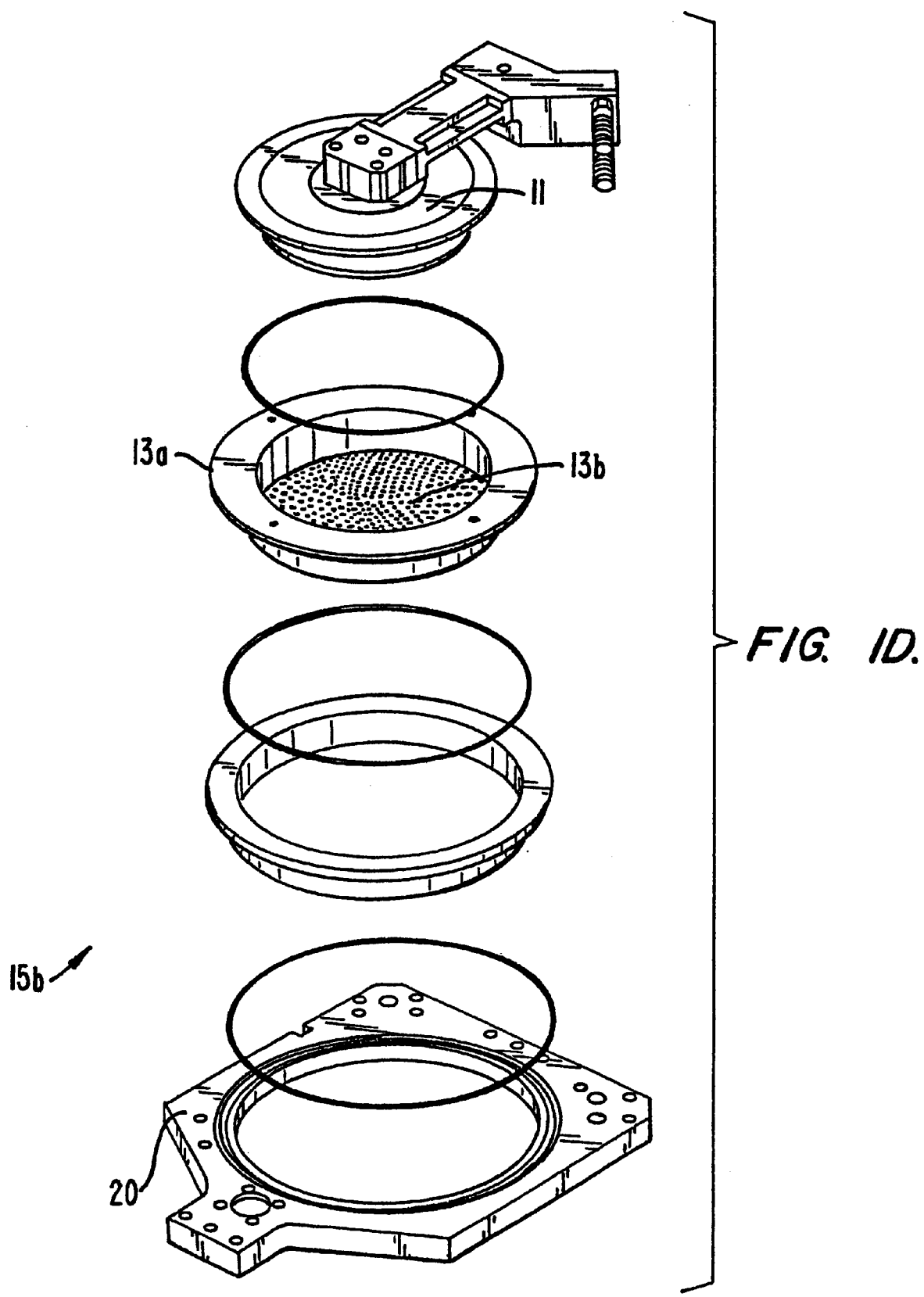

One suitable CVD machine in which the method of the present invention can be carried out is shown in FIGS. 1A and 1B, which are vertical, cross-sectional views of a chemical vapor deposition system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

Reactor 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be controllably moved between a lower loading/off-loading position (depicted in FIG. 1A) and an upper processing position (indicated by dashed line 14 in FIG. 1A and shown in FIG. 1B) which is closely adjacent to manifold 11. A centerboard (not shown) includes sensors for providing information on the position of the wafers.

Deposition and carrier gases are introduced into chamber 15 through perforated holes 13b (FIG. 10) of a conventional flat, circular gas distribution faceplate 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a.

Before reaching the manifold, deposition and carrier gases are supplied through gas supply lines 8 into a mixing system 9 where they are combined and then sent to manifold 11. Generally, the supply line for each process gas includes (i) several safety shut-off valves (not shown) that can be used to automatically or manually shut off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in reactor 10 can be either a thermal process or a plasma-enhanced process. In a plasma-enhanced process, an RF power supply 44 applies electrical power between the gas distribution faceplate 13a and the pedestal to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15.

During a deposition process, the plasma heats the entire process chamber 10, including the walls of the chamber body 15a surrounding the exhaust passageway 23 and the shutoff valve 24. When the plasma is not turned on, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products. It also improves the elimination of volatile products of the process gases and other contaminants which might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer. From the exhaust plenum 17, the gases flow underneath a lateral extension portion 21 of the exhaust plenum 17, past a viewing port 22, through a downward-extending gas passage 23, past a vacuum shut off valve 24 (whose body is integrated with the lower chamber wall 15a), and into the exhaust outlet 25 which connects to the external vacuum pump (not shown) through a foreline (also not shown).

The wafer support platter of the pedestal 12 (preferably aluminum) is heated using a double full-turn single-loop embedded heater element configured to form parallel concentric circles. An outer portion of the heater element runs adjacent to a perimeter of the support platter while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made from material such as aluminum or anodized aluminum. An example of such a CVD apparatus is described in U.S. Pat. No. 5,558,717 entitled "CVD Processing Chamber," issued to Zhao et al. The '717 patent is assigned to Applied Materials, Inc., the assignee of the present invention, and is hereby incorporated by reference in its entirety.

A lift mechanism and motor 32 raises and lowers the heater pedestal assembly 12 and its wafer lift pins 12b as wafers are transferred into and out of the body of the chamber by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 over control lines 36, of which only some are shown. Controller 34 relies on feedback from optical sensors to determine the position of moveable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular Europeans (VME) standard which defines board, card cage, and connector dimensions and types. The VME standard also defines the bus structure having a 16-bit data bus and 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices, for example, a floppy disk or another appropriate drive, may also be used to operate controller 34.

Figure 1E:
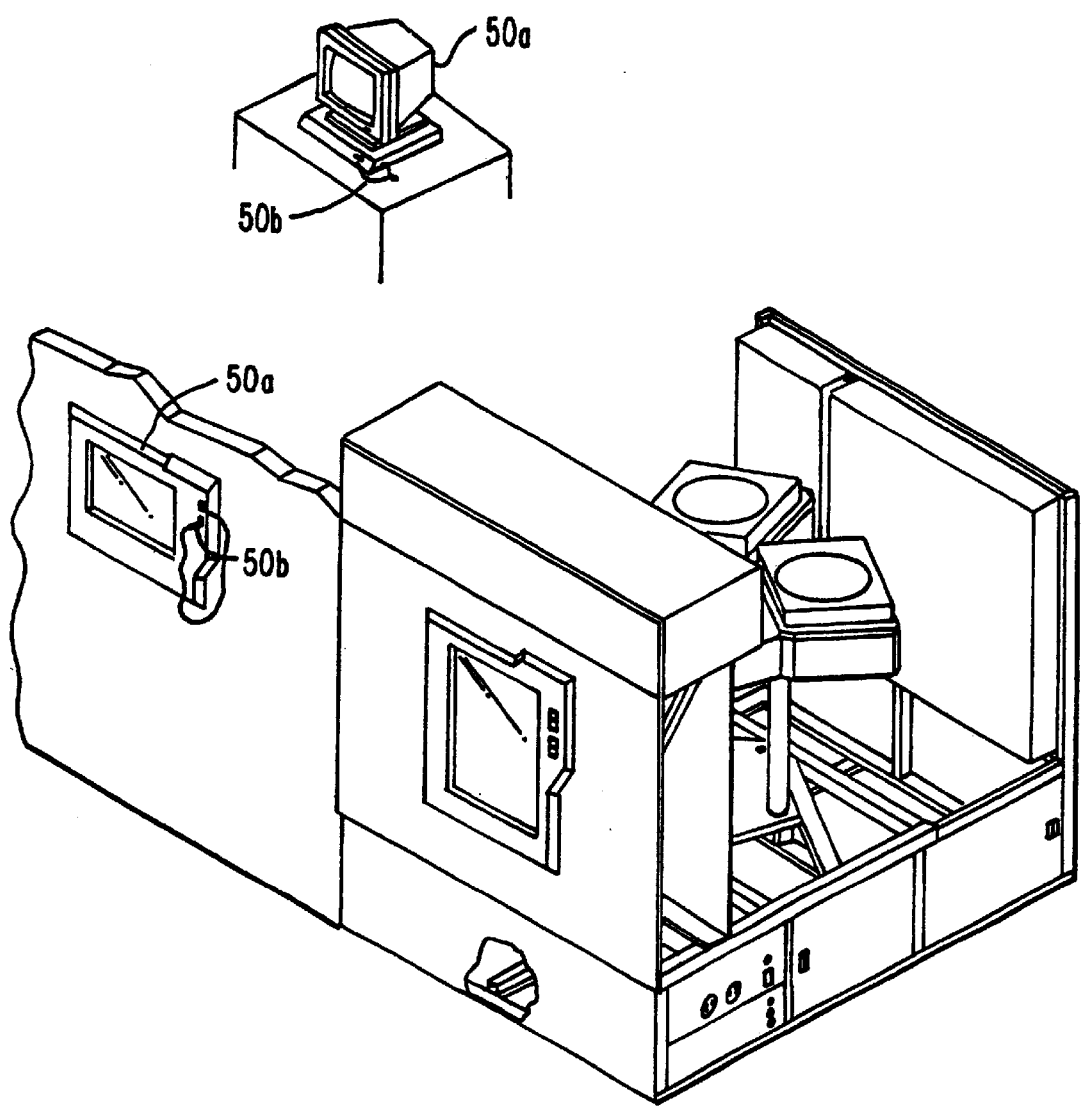
FIG. 1E is a simplified diagram of system monitor and CVD system in a multichamber system, which may include one or more chambers.

The interface between a user and controller 34 is via a CRT monitor 50a and light pen 50b, shown in FIG. 1E, which is a simplified diagram of the system monitor and CVD system 10 in a multichamber system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of the light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer-readable programming language; for example, 68000 assembly language, C, C++, Pascal, or Fortran. Suitable program code is entered into a single file, or multiple files, using a conventional text editor, and is stored or embodied in a computer-usable medium, such as a memory system of the computer. If the entered code text is in a high level language, the code is compiled or interpreted, and the resultant compiler code is then linked with an object code of precompiled windows library routines. To execute the linked compiled object code the system user invokes the object code, causing the computer system to load the code in memory. The CPU then reads and executes the code to perform the tasks identified in the program.

Figure 1F:
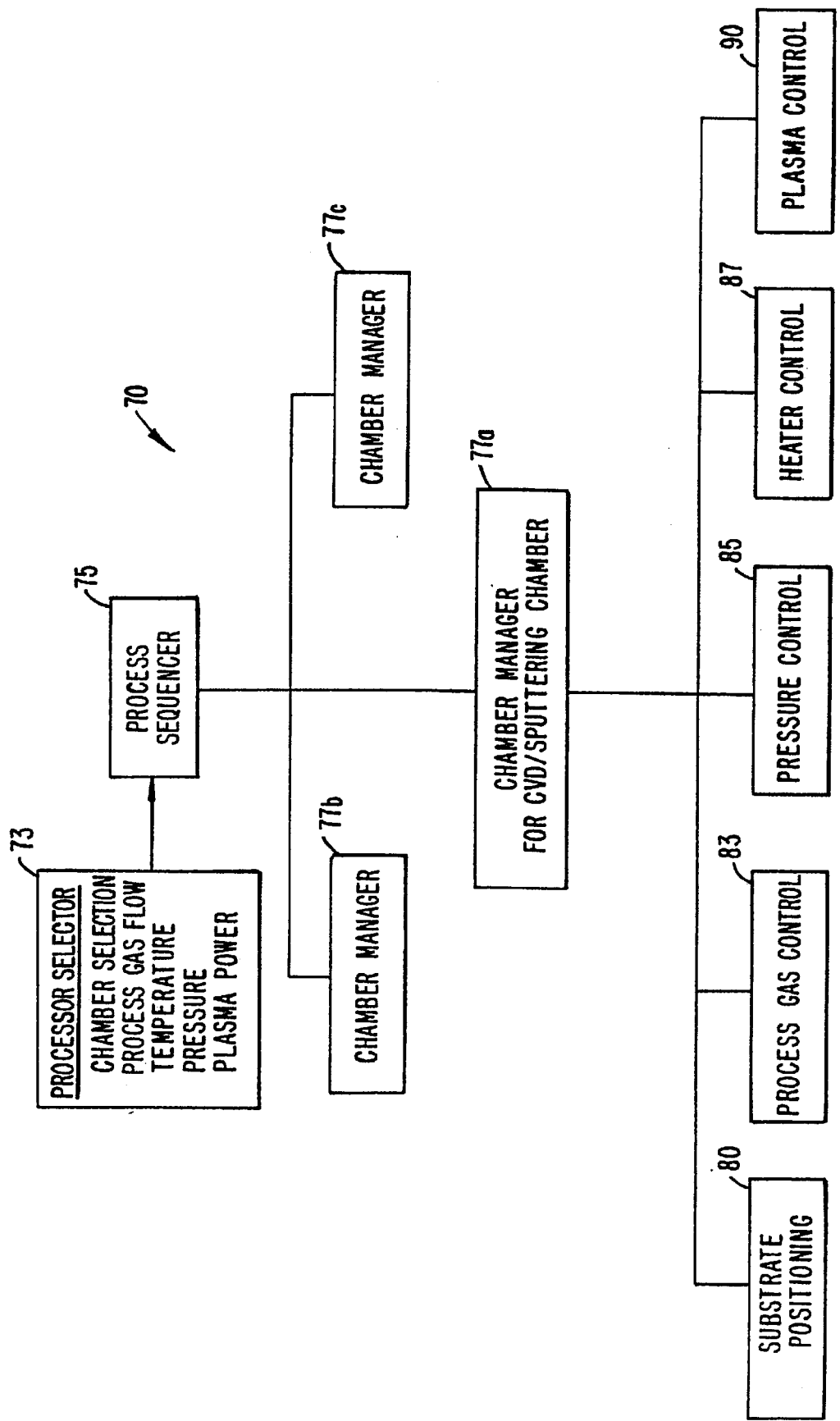
FIG. 1F shows an illustrative block diagram of the hierarchical control structure of the system control software, computer program 70, according to a specific embodiment.

FIG. 1F shows an illustrative block diagram of the hierarchical control structure of the system control software, computer program 70, according to a specific embodiment. Using the light pen interface, a user enters a process set number and process chamber number a process selector subroutine 73 in response to menus or screens displayed on the CRT monitor. The process sets are predetermined sets of parameters necessary to carry out specified processes, and are identified by predefined set numbers. The process selector subroutine 73 identifies (i) the desired process chamber, and (ii) the desired set of process parameters needed to operate the process chamber for performing the desired process. The parameters for performing a specific process relate to process conditions such as process gas composition and flow rates, temperature, pressure, plasma conditions such as RF power levels and the low-frequency RF frequency, cooling gas pressure, and chamber wall temperature and are provided to the user in the form of a recipe. The parameters specified by the process recipe are entered utilizing the light pen/CRT monitor interface. The signals for monitoring the process are provided by the analog and digital input boards of the system controller and the signals for controlling the process are output on the analog and digital output boards of the CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is to be executed next, the sequencer subroutine 75 initiates execution of the process set by passing the particular process set parameters to a chamber manager subroutines 77a–c which control multiple processing tasks in a process chamber 10 according to the process set determined by the sequencer subroutine 75. For example, the chamber manager subroutine 77a comprises program code for controlling sputtering and CVD process operations in the process chamber 15. The chamber manager subroutine 77 also controls execution of various subroutines which control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto the susceptor 12, and, optionally, to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps-up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is introduced into the chamber 15 to stabilize the pressure in the chamber before reactive process gases are introduced. For these processes, the process gas control subroutine 83 is programmed to include steps for flowing the inert gas into the chamber 15 for the time necessary to stabilize the pressure in the chamber, and then the steps described above would be carried out. Additionally, when a process gas is to be vaporized from a liquid precursor, for example tetraethylorthosilane ("TEOS"), the process gas control subroutine 83 is written to include steps for bubbling a delivery gas, such as helium, through the liquid precursor in a bubbler assembly or introducing a carrier gas, such as helium, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure nanometers connected to the chamber, comparing the measured value(s) to the target pressure, obtaining PID (proportional, integral, and differential) values from a stored pressure table corresponding to the target pressure, and adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or setpoint, temperature parameter. The heater control subroutine 87 measures the temperature by measuring voltage output of a thermocouple located in a susceptor 12, comparing the measured temperature to the setpoint temperature, and increasing or decreasing current applied to the heating unit to obtain the setpoint temperature. The temperature is obtained from the measured voltage by looking up the corresponding temperature in a stored conversion table, or by calculating the temperature using a fourth order polynomial. When an embedded loop is used to heat the susceptor 12, the heater control subroutine 87 gradually controls a ramp-up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting low and high frequency the RF power levels applied to the process electrodes in the chamber 15, and to set the low frequency RF frequency employed. Similar to the previously described chamber component subroutines, the plasma control subroutine 90 is invoked by the chamber manager subroutine 77a.

The above reactor description is mainly for illustrative purposes, and other plasma CVD equipment such as electron cyclotron resonance (ECR) plasma CVD devices, induction-coupled RF high density plasma CVD devices, or the like may be employed. Additionally, variations of the above-described system, such as variations in susceptor design, heater design, RF power frequencies, location of RF power connections, and others are possible. For example, the wafer could be supported and heated by a quartz lamp. The layer and method for forming such a layer of the present invention is not limited to any specific apparatus or to any specific plasma excitation method.

II. Exemplary Structure

Figure 2:
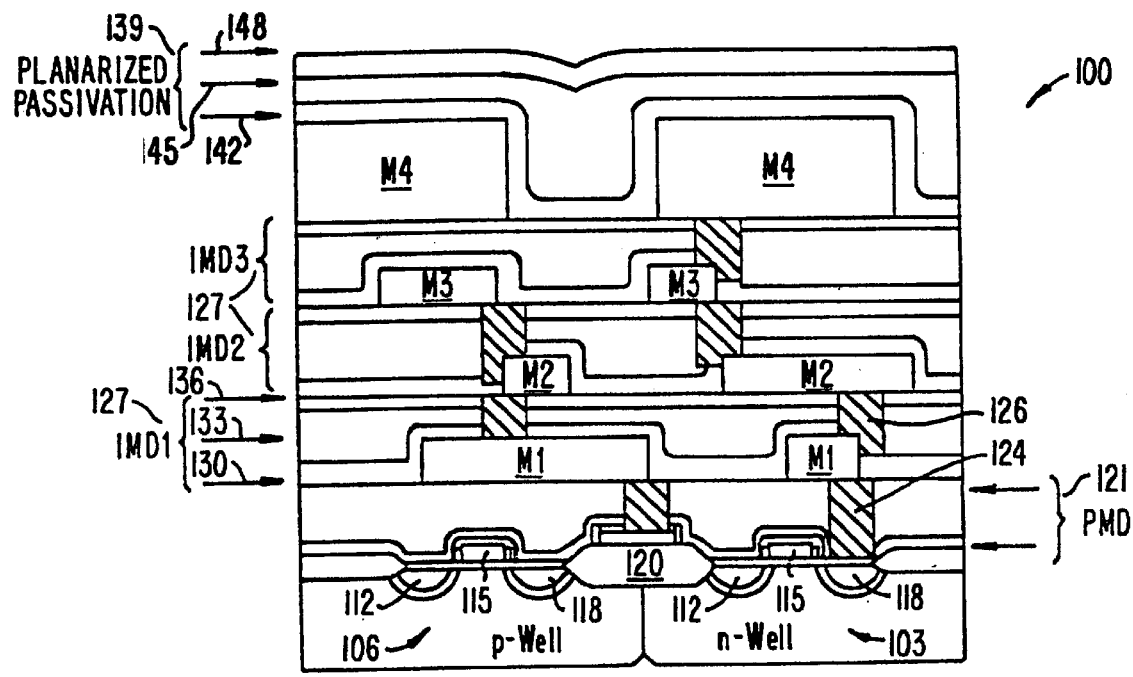
FIG. 2 is a simplified cross-sectional view of an integrated circuit 600 according to the present invention.

FIG. 2 illustrates a simplified cross-sectional view of an integrated circuit 100 according to the present invention. As shown in FIG. 2, integrated circuit 100 includes NMOS and PMOS transistors 103 and 106, which are separated and electrically isolated from each other by a field oxide region 120. Each transistor 103 and 106 comprises a source region 112, a gate region 115, and a drain region 118.

A premetal dielectric layer 121 separates transistors 103 and 106 from metal layer M1, with connections between metal layer M1 and the transistors made by contacts 124. Metal layer M1 is one of four metal layers, M1–M4, included in integrated circuit 100. Each metal layer M1–M4 is separated from adjacent metal layers by respective inter-metal dielectric layers 127 (IMD1, IMD2 and IMD3). IMD layers 127 may include a PECVD lining layer 130, an SACVD gap-fill layer 133 and a cap layer 136. Adjacent metal layers are connected at selected openings by vias 126. Deposited over metal layer M4 are planarized passivation layers 139. Like IMD layers 127, passivation layer 139 may include a lining layer 142, a gap-fill layer 145, and a cap layer 148.

The layer of the present invention may find uses in each of the dielectric layers shown in integrated circuit 100. The layer of the present invention may also be used in damascene layers which are included in some integrated circuits. In damascene layers, a blanket layer is deposited over a substrate, selectively etched through to the substrate, and then filled with metal and etched back or polished to form metal contacts such as M1. After the metal layer is deposited, a second blanket deposition is performed and selectively etched. The etched areas are then filled with metal and etched back or polished to form vias 126.

It should be understood that the simplified integrated circuit 100 is for illustrative purposes only. One of ordinary skill in the art could implement the present method for fabrication of other integrated circuits, such as microprocessors, application-specific integrated circuits (ASICS), memory devices, and the like.

III. Reducing Surface Sensitivity of an SACVD Silicon Oxide Layer

The present invention may be employed to reduce surface sensitivity of an SACVD layer formed over a substrate in an in situ process in a substrate processing chamber such as the exemplary chamber described above.

Figure 3:
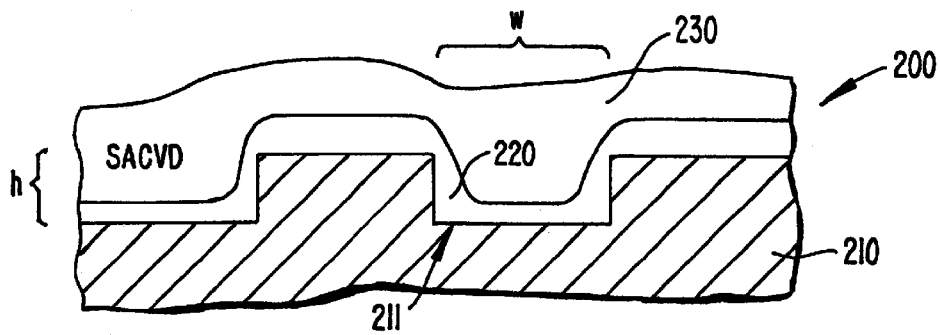
FIG. 3 is a cross-sectional view of a film formed utilizing an embodiment of the preferred invention.
Figure 4:
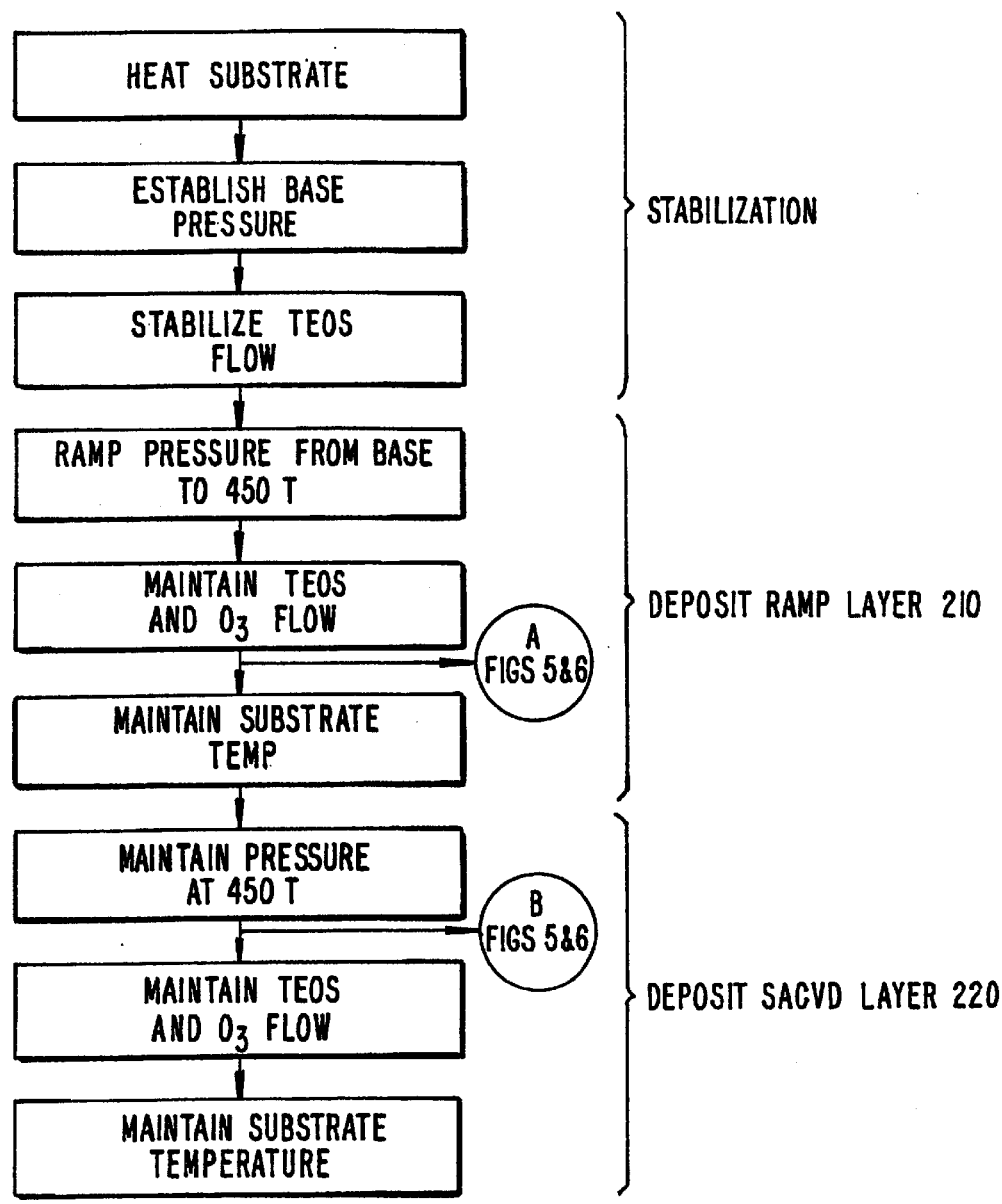
FIG. 4 is a flowchart illustrating steps undertaken in formation of a film according to one embodiment of the method of the present invention.
Figure 5:
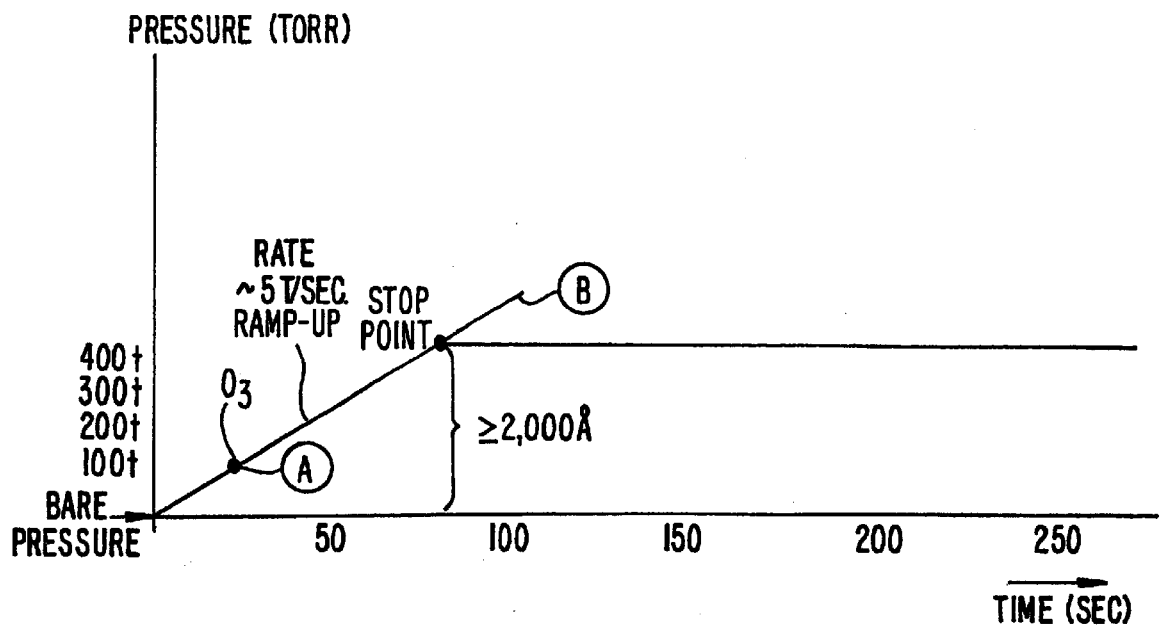
FIG. 5 is a graph depicting pressure as a function of time during the process of a preferred embodiment.

A silicon oxide layer formed in accordance with the present invention is depicted in FIG. 3. A first preferred embodiment, a method for forming the layer, is set forth in the flow chart of FIG. 4 and illustrated by the graph of FIG. 5. Referring to FIGS. 3, 4, and 5, a silicon oxide layer 200 is deposited over a substrate 210, for example, metal, steam oxide, or a lining PECVD layer having a gap 211 of height "h" and width "w" of less than 0.5 microns. A ramp-up layer 220 overcoats the substrate and an SACVD layer 230 is deposited over the ramp-up layer.

Table 2 presents a recipe for forming the silicon dioxide layer depicted in FIG. 1 in a CVD machine.

lower. However, at this low rate the ramp film thickness is greater than 2,000 Angstroms because of the amount of time required to attain the target pressure. This thickness is too large to be an acceptable alternative for geometries of approximately 0.50 microns since the gap would be filled by the ramp film 220 instead of the high quality SACVD layer 230. For other geometries, however, such a large ramp film thickness could be acceptable.

Figure 6:
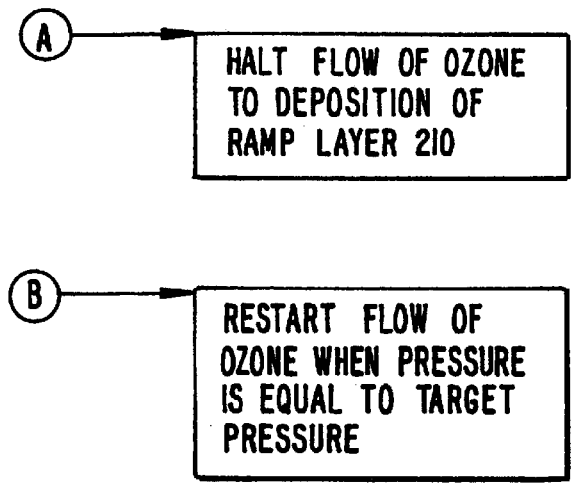
FIG. 6 depicts steps added to the steps depicted in the flowchart of FIG. 4 utilized in another preferred embodiment of the invention.

FIG. 5 also depicts an alternative process (described by the flow chart of FIGS. 4 and 6, with the steps A and B of FIG. 4 set out in FIG. 6) which reduces the surface sensitivity by utilizing a slow ramp-up rate while also reducing the thickness of the ramp-up layer 220. The stabilization steps are the same. However, during pressure ramp-up the flow of ozone is halted (step A) prior to completion of the ramp-up to stop deposition of the ramp film 220 at a predetermined thickness. The pressure continues to ramp until the target deposition pressure is attained. The flow of ozone is then recommenced (step B) to react with TEOS at the deposition pressure to form a high quality SACVD silicon oxide layer 230 over a thin ramp layer 220.

TABLE 2

Partial Deposition Recipe for Pressure Ramp-Up Evaluation

| Step number, name | 1. Stabilization | 2. TEOS Start | 3. TEOS Stabilize | 4. Deposition |
|---|---|---|---|---|
| Chamber Selection | All | All | All | All |
| Step end control | By Time | By Time | By Time | By Time |
| Pressure | Throttle Fully Open | Throttle Fully Open | Throttle Fully Open | Servo 450 Torr |
| Pressure Ramp-Rate | — | — | — | 5 Torr/sec |
| HF RF Power | 0 W | 0 W | 0 W | 0 W |
| LF RF Power | 0 W | 0 W | 0 W | 0 W |
| Susc Temperature | 415° C. | 415° C. | 415° C. | 400° C. |
| Susceptor Spacing | 600 mils | 600 mils | 600 mils | 250 mils |
| Gas names & flows | O2 3000 He(PLIS) 4000 | O2 3000 He(PLIS) 4000 | O2 3000 He(PLIS) 4060 | O3 5000 He(PLIS) 4000 |

Prior to depositing the ramp-up layer 220 the chamber is stabilized to a base pressure. During the stabilization phase the throttle of the exhaust system vacuum pump is fully open to establish the base pressure at the lowest possible value, typically on the order of several millitorr. During stabilization the TEOS flow is stabilized and the substrate is heated to near the process temperature.

The deposition of the ramp-up layer is commenced by introducing ozone into the chamber and closing the throttle valve to a desired setting to reduce the exhaust rate. As depicted in FIG. 5, the reduced exhaust rate will cause the pressure in the chamber to start increasing at a nearly constant ramp-up rate. When the pressure increases to a predetermined target value, in this case 450 torr, the pressure control subroutine 85 maintains the pressure at the target pressure. The deposition process gases of ozone and TEOS are reacted while the pressure ramps from base pressure to a target deposition pressure to form the ramp-up layer 220.

As described more fully below in part IV, test results indicate that the reduction of the surface sensitivity of the SACVD increases as the ramp-up pressure decreases. However, the thickness of the ramp-up layer 220 increases as the pressure ramp-up rate decreases because the time required to reach the target pressure increases.

For example, based on experiment, the pressure ramp-up rate should be controlled to a slow rate of about 5 torr/sec or For example, during pressure ramp-up, the ramp rate is maintained at about 5 torr/sec and the TEOS/O₃ process gas is reacted until the pressure in the chamber is about 100 torr. At that time the flow of O₃ is halted to stop the formation of the ramp layer 220 and the ramp rate is increased to attain the target deposition pressure. When the target deposition pressure is attained the flow of O₃ is restarted and the SACVD layer 230 is deposited.

IV. EXAMPLES, TEST RESULTS, AND MEASUREMENTS

Experiment #1

Pressure Ramp-Up Evaluation Based on Variation of Ramp-Up Rate

The recipe depicted in Table 2 was common to all SACVD USG films deposited in this evaluation with the exception of changes to the ramp-up rate. Pressure ramp rates of 30 torr/sec (throttle fully closed), 15 torr/sec, 10 torr/sec, and 5 torr/sec from base pressure to deposition pressure were evaluated.

Results and Discussion for Pressure Ramp-Up Film

Figure 7:
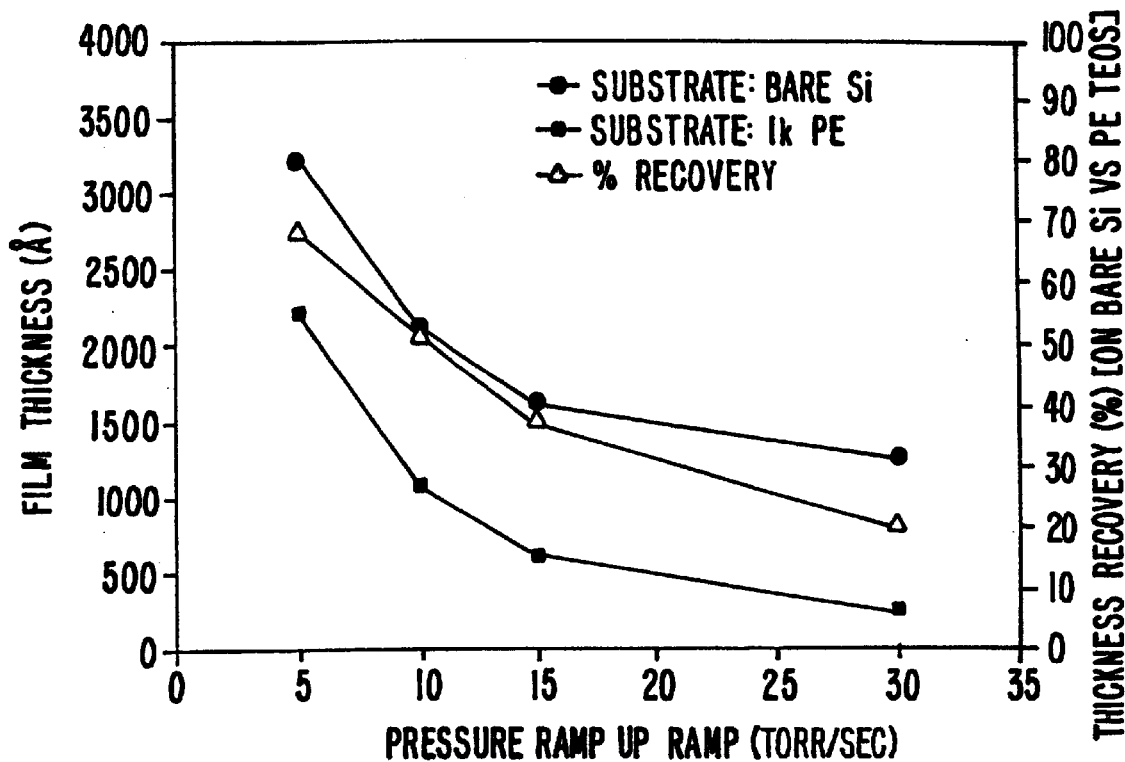
FIG. 7 is a graph depicting the thickness of the ramp layer for various ramp pressures and the ratio of the thickness of layers deposited on bare silicon to layers deposited on PE TEOS substrate.

The film deposited during the pressure ramp-up was evaluated by stopping the recipe as soon as the pressure reached 450 torr. The time for the pressure to ramp to deposition pressure was consistent over several trials for the various ramp-up rates evaluated. These films were deposited on both bare silicon and 1 kÅPE TEOS substrates. All wafers were processed in Universal Chamber B on System 4476 in the Santa Clara Applications lab of Applied Materials. The chamber was equipped with the following hardware: TISABB thin plate susceptor with a 150 mm pocket, 100SX blocker, anodized faceplate, and standard pumping plate. Ozone was generated by an Astex ozonator and ozone concentration was measured with an IN USA monitor. The deposition thicknesses on these two substrates is compared below in Table 3. The data is shown graphically in FIG. 7.

ment #1 is that a very slow ramp rate can eliminate surface sensitivity, experiment #2 was conducted to investigate the effects of changing other processing parameters. Since the $O_3$ flow and concentration should ideally remain fixed, a parameter evaluated is TEOS flow. The current TEOS flow in the SACVD USG recipe is 325 mgm. Experiment #2 was run to investigate using lower flows of TEOS. The lowest controllable flow with the 1.5 g LFM's is approximately 100 mgm.

CONCLUSIONS

SACVD USG surface sensitivity to barrier substrate materials can be minimized by slowly ramping from base

TABLE 3

| Pressure Ramp Rate (Torr/sec) | Ramp Time from Base Pressure to Deposition Pressure (sec) | Thickness on Bare Silicon (Å) | Thickness on PE TEOS Dubstrate (Å) | Thickness Recovery on Bare Silicon vs. PE TEOS Substrate (%) |
|---|---|---|---|---|
| 30 | 17 | 1250 | 250 | 20 |
| 15 | 26 | 1605 | 600 | 37 |
| 10 | 38 | 2103 | 1074 | 51 |
| 5 | 76 | 3216 | 2202 | 68 |

The effectiveness of these intermediate films in eliminating the surface sensitivity of SACVD USG films to PE TEOS substrates was quantified by comparing wet etch rate ratios of the films to thermally grown steam oxide in 100:1 HF solution at room temperature.

Figure 8:
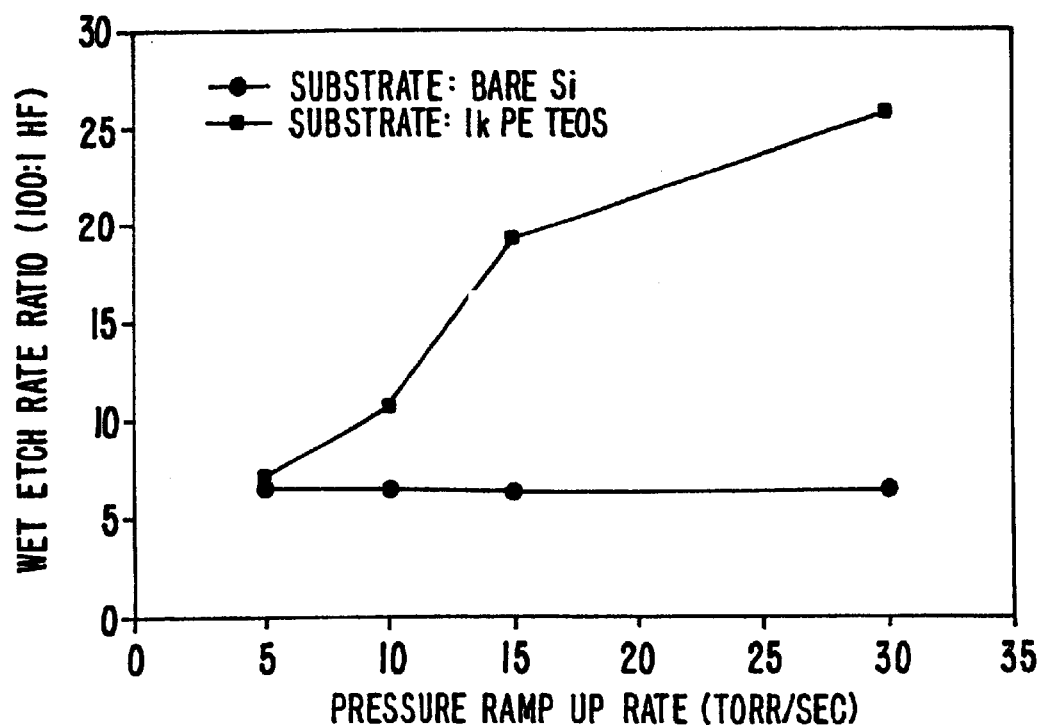
FIG. 8 is a graph depicting wet etch rates.

The duration the deposition step was fixed at 267 seconds for all pressure ramp-up rates. These SACVD USG films with intermediate "ramp-up" films were deposited on both bare silicon and PE TEOS substrates. Table 4 is a comparison of the wet etch rate ratios of SACVD USG films with different ramp-up rates on bare silicon and PE TEOS substrates. The data is shown graphically in FIG. 8.

TABLE 4

| Pressure Ramp Rate (Torr/sec) | WERR SA Film with Pressure Ramp-Up on Bare Silicon | WERR SA Film with Pressure Ramp-Up on 1 KÅPE TEOS |
|---|---|---|
| 30 | 6.49 | 25.84 |
| 15 | 6.40 | 19.23 |
| 10 | 6.43 | 10.7 |
| 5 | 6.46 | 7.12 |

Etchant solution: 100:1 HF at room temperature, 12 minute dip.

All SACVD USG films appeared hazy after etch except for the film with a 5 torr/sec ramp-up rate. Any sign of haziness in a SACVD USG film after an etch in acid is an indication that surface sensitivity exists and has not been eliminated. When surface sensitivity exists, the SACVD USG film quality is highly porous and will result in a high wet etch rate when etched in acid solution.

Although a very slow ramp rate of 5T/sec appears to eliminate the surface sensitivity of SACVD USG to PE TEOS films, the thickness of this intermediate layer is relatively thick at approximately 2200 Å. If this film is deposited, the entire gap for $\leq 0.45$ μm spacings will be filled with this intermediate film and not with SACVD USG.

In this evaluation, pressure ramp-up rate was the only parameter investigated. Since the conclusion from experiment #1 is that a very slow ramp rate can eliminate surface sensitivity, experiment #2 was conducted to investigate the effects of changing other processing parameters. Since the $O_3$ flow and concentration should ideally remain fixed, a parameter evaluated is TEOS flow. The current TEOS flow in the SACVD USG recipe is 325 mgm. Experiment #2 was run to investigate using lower flows of TEOS. The lowest controllable flow with the 1.5 g LFM's is approximately 100 mgm.

pressure to deposition pressure while reacting both $O_3$ and TEOS. The ramp rate should be controlled to a slow rate of at least 5 torr/sec.

Experiment #2

Pressure Ramp-Up Evaluation Utilizing Design of Experiments (DOE) with RS-1

A full factorial design of experiments (herein DOE) was developed to further investigate the optimization of a ramp-up film to eliminate surface sensitivity of SACVD USG films to barrier substrate materials. The ramp-up pressure range was maintained at base pressure to deposition pressure of 450 torr.

All wafers were processed in Universal Chamber A on System 4322 in the Santa Clara Applications lab. All films were deposited on 200 mm wafers. The chamber was equipped with the following hardware: TISABB thin plate susceptor, 100EH blocker, anodized faceplate, and plenum pumping plate. Ozone was generated by an Astex ozonator and ozone concentration was measured with an IN USA monitor.

The full factorial ($2^4$) DOE was run on the following parameters: TEOS Flow, Helium Flow, Spacing, and Pressure Ramp Rate. Ozone flow and concentration were maintained at SACVD USG deposition conditions of 5000 sccm and 12.5 wt %, respectively. These conditions were not changed since cycling of the ozone conditions is not recommended for optimal performance of the ozonators. The centerpoint process in this DOE is the average of the high and low values for each parameter varied. A total of four centerpoint conditions were run with two sets run as the first and last experiments. One wafer was run for each experiment; therefore the assumption was made that wafer quality is not a contributor to the results. Reclaimed particle wafers were used in this experiment.

The ramp-up only film and the composite ramp film with SACVD USG were deposited on both bare silicon and thermally grown steam oxide substrates. Steam oxide wafers were grown to thicknesses of approximately 2000 Å and were premeasured prior to pressure ramp-up SACVD USG deposition. Steam oxide substrates were used instead of PE TEOS since SACVD USG exhibits more severe surface sensitivity on steam oxide than on PE TEOS. The objective of this experiment is to determine a universal method of eliminating surface sensitivity which is applicable to all substrates. Film thickness and wet etch rates were measured for both stand-alone ramp films and for the composite ramp and SACVD USG films on both substrates. All wafers were etched with a thermally grown steam oxide reference in 100:1 HF solution at room temperature for 12 minutes for SACVD USG films and for 30 seconds to 2 minutes for the ramp only films. A summary of the parameters varied in the DOE and the response parameters are outlined below in Table 5.

TABLE 5

Summary of DOE Variables and Response Parameters

| DOE Variables | | High | Low | Center |
|---|---|---|---|---|
| 1. | Helium Flow (sccm) | 4000 | 1000 | 2500 |
| 2. | Spacing | 600 | 180 | 390 |
| 3. | TEOS Flow (mgm) | 600 | 150 | 375 |
| 4. | Pressure Ramp Rate (Torr/sec) | 30 | 3 | 18 |
| | | (throttle fully closed) | | |

| | Measured Responses on Bare Silicon Substrate | | Measured Responses on Thermally Grown Steam Oxide Substrate |
|---|---|---|---|
| 1. | Thickness of Ramp Film | 1. | Thickness of Ramp Film |
| 2. | Thickness of Ramp Film + SACVD USG | 2. | Thickness of Ramp Film + SACVD USG |
| 3. | Wet Etch Rate of Ramp Film | 3. | Wet Etch Rate of Ramp Film |

TABLE 5-continued

Summary of DOE Variables and Response Parameters

| 4. | Wet Etch Rate of Ramp Film + SACVD USG | 4. | Wet Etch Rate of Ramp Film + SACVD USG |
|---|---|---|---|

These parameters were incorporated in a "Ramp-Up" step prior to SACVD USG deposition. SACVD USG ozone flow and concentration deposition conditions were maintained at the values set forth above. The first five steps of the deposition recipe are outlined below in Table 6. The values which were varied are denoted by the variable "X". The actual DOE setup is outlined in Table 7.

TABLE 6

Partial Deposition Recipe for Pressure Ramp-Up DOE

| Step number name | 1. Stabilization | 2. TEOS Start | 3. TEOS Stabilize | 4. Ramp-Up | 5. SACVD USG Deposition |
|---|---|---|---|---|---|
| Chamber Selection | All | All | All | All | All |
| Step end control | By Time | By Time | By Time | Press>445 Torr | By Time |
| Pressure | Throttle Fully Open | Throttle Fully Open | Throttle Fully Open | Servo 450 Torr | Servo 450 Torr |
| Pressure Ramp Rate | | | | X Torr/sec | |
| HF RF Power | 0 W | 0 W | 0 W | 0 W | 0 W |
| LF RF Power | 0 W | 0 W | 0 W | 0 W | 0 W |
| Susc Temperature | 415° C. | 415° C. | 415° C. | 400° C. | 400° C. |
| Susceptor Spacing | 600 mils | 600 mils | 600 mils | X mils | 250 mils |
| Gas names & flows | O2 3000 | O2 3000 | O2 3000 | O2 5000 | O2 5000 |
| | He(PLIS) 4000 | He(PLIS) 1000 | He(PLIS) 4000 | He(PLIS) XXXX | He(PLIS) 4000 |
| | | TEOS 4000 mgm | TEOS 325 mgm | TEOS XXX mgm | TEOS 325 mgm |

TABLE 7

Pressure Ramp-Up DOE Setup

| Experiment # | 1. Helium Flow | 2. Spacing | 3. TEOS Flow | 4. Ramp Rate |
|---|---|---|---|---|
| 1 | 2500 | 390 | 375 | 18 |
| 2 | 1000 | 600 | 600 | 5 |
| 3 | 1000 | 180 | 150 | 30 |
| 4 | 2500 | 390 | 375 | 18 |
| 5 | 4000 | 600 | 150 | 30 |
| 6 | 1000 | 600 | 150 | 5 |
| 7 | 1000 | 600 | 600 | 30 |
| 8 | 1000 | 180 | 600 | 5 |
| 9 | 4000 | 180 | 150 | 5 |
| 10 | 4000 | 600 | 150 | 5 |
| 11 | 1000 | 180 | 150 | 5 |
| 12 | 4000 | 180 | 600 | 5 |
| 13 | 4000 | 180 | 150 | 30 |
| 14 | 4000 | 606 | 600 | 5 |
| 15 | 2500 | 390 | 375 | 18 |
| 16 | 1000 | 600 | 150 | 30 |
| 17 | 4000 | 180 | 600 | 30 |
| 18 | 4000 | 600 | 600 | |
| 19 | 1000 | 180 | 600 | |
| 20 | 2500 | 390 | 375 | |

Results and Discussion for Pressure Ramp-Up DOE

The effect of each parameter in order of decreasing effect on each response parameter is outlined below in Table 8.

TABLE 8

Effect of Parameters on Responses in DOE

| Response | Effects of Process Variables | No Effect on Process Variable |
|---|---|---|
| Ramp Thickness on Bare Silicon | TEOS>Ramp>Spacing>>Helium | |
| Composite Thickness Ramp + SACVD USG on Bare Silicon. | TEOS>Spacing>Ramp>>Helium | |
| Ramp Thickness on Steam Oxide | TEOS>Ramp>Spacing | Helium |
| Composite Thickness Ramp + SACVD USG on Steam Oxide | TEOS>Ramp>Spacing | Helium |
| WERR Ramp on Bare Silicon | TEOS>>Helium>Spacing | |
| WERR Ramp + SACVD USG on Bare Silicon | Spacing>Ramp>TEOS>Helium | Ramp Rate |
| WERR Ramp on Steam Oxide | TEOS>>Spacing>Ramp | Helium |
| WERR Ramp + SACVD USG on Steam Oxide | Spacing>>TEOS>Ramp | Helium |

WERR = Wet Etch Rate Ratio reference to thermally grown steam oxide in 100:IHF solution at room temperature.

The wet etch rate ratio of the composite ramp and SACVD USG film on thermally grown steam oxide barrier was used as the primary screening response for determining if the pressure ramp-up condition was successful in eliminating or at least minimizing SACVD USG surface sensitivity. As a reference, the WERR of the BKM SACVD USG recipe in 100:1 HF is $\leq 6.5$. The only two conditions in which the composite ramp and SACVD USG films on steam oxide substrates were not completely etched away were for the smallest spacing (180 mils), highest TEOS flow (600 mils), and slowest ramp-up rate (5 torr/sec). Wet etch results on thermally grown steam oxide appeared to be independent of helium flow. However, on bare silicon, the wet etch rate ratio was slightly better (6.7 vs. 7.9) for the condition with highest helium flow (4000 sccm) and the aforementioned conditions. However, this condition also resulted in the thickest ramp film at 4000 Å. This thickness is too large for geometries of less than 0.5 $\mu$m since the gap would be filled with an oxide other than SACVD USG. However, this experiment confirms earlier results from Experiment #1. The slower the ramp rate and the thicker the resulting film deposition, the better the reduction of surface sensitivity of SACVD USG to barrier substrate materials.

The optimum conditions and resulting response values based on the model predictions of the RS-1 statistical software are summarized below in Table 9.

TABLE 9

RS-1 Model Predictions for Pressure Ramp Process
Optimum Condition:
He = 2718 sccm Spacing = 180 mils TEOS = 422 mgm
Ramp Rate = 5 torr/sec

| Model Predictions and Modeling Quality: Response | Model Predictions | $R^2$ |
|---|---|---|
| Thickness Ramp Film on Bare Silicon | 2654 Å | 0.9905 |
| Thickness of Ramp Film and SACVD ESG on Bare Silicon | 11224 Å | 0.9838 |
| Thickness Ramp Film on Steam Oxide | 1316 Å | 0.9823 |
| Thickness of Ramp Film and SACVD USG on Steam Oxide | 9031 Å | 0.9239 |
| WERR Ramp Film on Bare Silicon | 9.0 | 0.7308 |
| WERR Ramp Film and SACVD USG on Bare Silicon | 6.9 | 0.7695 |

TABLE 9-continued

RS-1 Model Predictions for Pressure Ramp Process
Optimum Condition:
He = 2718 sccm Spacing = 180 mils TEOS = 422 mgm
Ramp Rate = 5 torr/sec

| Model Predictions and Modeling Quality: Response | Model Predictions | $R^2$ |
|---|---|---|
| WERR Ramp Film on Steam Oxide | 10 | 0.8172 |
| WERR Ramp Film and SACVD USG on Steam Oxide | 11.9 | 0.5278 |

$R^2$ represents the accuracy of the model for each response parameter

The results of the RS-1 Design of Experiments confirms the results of Experiment #1. Surface sensitivity of SACVD USG can be minimized by using a slow ramp rate.

The invention has now been described with reference to the preferred embodiments and specific examples. Although the target deposition pressure was 450 torr in the examples, other target deposition pressures can be utilized depending on the desired characteristics of the film. Similarly, all recipe parameters can be varied to compensate for different chambers or different substrate properties as is well known in the art. Although a particular system controller and process control software have been described in detail there are many variations that will be apparent. Additionally, in the preferred embodiment the computer code executed by the system controller is stored on a magnetic medium in a hard disk drive. The code could be stored in any computer medium such as a CD ROM or other types of ROM or any other media capable of storing computer code. Further, although the storage medium in the preferred embodiment is near the computer, the storage medium could be remote and coupled to the computer via fiber optic cables, telephone lines, or the Internet. Other alternatives and substitutions will be apparent to persons of skill in the art. Accordingly, it is not intended to limit the invention except as provided in the appended claims.

What is claimed is:

1. A substrate processing system for depositing a film on the major surface of a substrate, said system comprising:

a vacuum chamber;

a substrate heating system for supplying thermal energy to heat said substrate;

a gas delivery system configured to deliver a process gas to said vacuum chamber;

a vacuum system for reducing the pressure in said vacuum chamber;

a system controller, including a computer for controlling said gas delivery system, said substrate heating system, and said vacuum system; and a memory coupled to said controller comprising a computer-usable medium having a computer-readable program code physically embodied therein for directing operation of said substrate processing system, said computer-readable program code including:

computer-readable program code for causing said gas delivery system to introduce a process gas combination comprising TEOS and $O_3$ into said chamber and to cause said vacuum system to reduce the pressure in the chamber to a low base level;

computer-readable program code for causing said vacuum system to increase the pressure in the chamber at a substantially constant ramp-up rate from the low base pressure to a target subatmospheric deposition pressure and causing said substrate heating system to supply thermal energy to react the TEOS and $O_3$ in the process gas combination to deposit a ramp silicon oxide layer over the major surface of the substrate;

computer-readable program code for causing said gas delivery system to terminate the flow of $O_3$ a predetermined time after the pressure starts to increase, to stop the deposition of the ramp silicon oxide layer prior to the attainment of the target subatmospheric deposition pressure; and computer-readable program code for causing said vacuum system to maintain the pressure in the chamber at the target deposition pressure when the target pressure is attained, causing the gas delivery system to restart the flow of $O_3$ when the target deposition pressure is attained, and causing said substrate heating system to supply thermal energy to react the TEOS and $O_3$ in the process gas combination while the pressure is equal to the target deposition pressure to form an SACVD layer over the ramp silicon oxide layer.

2. The system of claim 1 wherein said computer-readable program code for causing said gas delivery system to terminate the flow of $O_3$ further comprises:

computer-readable program code for causing the gas delivery system to terminate the flow of $O_3$ when the pressure in the chamber is equal to about 100 torr.

3. A substrate processing system for depositing a film on the major surface of a substrate, said system comprising:

a vacuum chamber;

a substrate heating system for supplying thermal energy to heat said substrate;

a gas delivery system configured to deliver a process gas to said vacuum chamber;

a vacuum system for reducing the pressure in said vacuum chamber;

a system controller, including a computer for controlling said gas delivery system, said substrate heating system, and said vacuum system; and a memory coupled to said controller comprising a computer-usable medium having a computer-readable program code physically embodied therein for directing operation of said substrate processing system, said computer-readable program code including:

computer-readable program code for causing said gas delivery system to introduce a process gas combination comprising TEOS and $O_3$ into said chamber and to cause said vacuum system to reduce the pressure in the chamber to a low base level;

computer-readable program code for causing said vacuum system to increase the pressure in the chamber at a substantially constant ramp-up rate from the low base pressure to a target subatmospheric deposition pressure and causing said substrate heating system to supply thermal energy to react the TEOS and $O_3$ in the process gas combination to deposit a ramp silicon oxide layer over the major surface of the substrate; and computer-readable program code for causing said vacuum system to maintain the pressure in the chamber at the target deposition pressure when the target pressure is attained, and causing said substrate heating system to supply thermal energy to react the TEOS and $O_3$ in the process gas combination while the pressure is equal to the target deposition pressure to form an SACVD layer over the ramp silicon oxide layer.

4. The system of claim 3 wherein said vacuum system includes a throttle valve for controlling the rate at which the chamber is evacuated and with said computer-readable program code for causing said vacuum system to reduce the pressure in the chamber to a low base level comprises:

computer-readable program code for setting said throttle valve to evacuate the chamber at a maximum rate.

5. The system of claim 3 wherein said computer-readable program code for causing said gas delivery into introduce a process gas into the vacuum chamber comprises:

computer-readable program code for varying the flow of TEOS to reduce surface sensitivity.

6. An apparatus for depositing one or more layers over a substrate disposed within a vacuum chamber of said apparatus, comprising:

means for introducing the substrate into the vacuum chamber;

means for establishing a base pressure in the vacuum chamber;

means for introducing a process gas comprising TEOS and $O_3$ into said chamber;

means for increasing the pressure at a substantially constant rate from the base pressure to a target subatmospheric deposition pressure;

means for supplying thermal energy to react TEOS and $O_3$ of said process gas without forming a plasma while pressure is increasing to form the ramp layer on the substrate;

means for maintaining said target deposition pressure when the pressure in the chamber becomes equal to the target deposition pressure; and means for supplying thermal energy to react the process gas without forming a plasma while pressure is equal to the target deposition pressure to form the SACVD layer over the ramp layer.

7. A substrate processing system for depositing a film on a substrate, the system comprising:

a vacuum chamber;

a substrate heating system for supplying thermal energy to heat the substrate;

a gas delivery system configured to deliver a process gas to the vacuum chamber;

a vacuum system for adjusting the pressure in the vacuum chamber;

a system controller configured to control the gas delivery system, the substrate heating system, and the vacuum system; and a memory, coupled to the controller, comprising a computer-readable medium having a computer-readable program embodied therein for directing operation of the substrate processing system, the computer-readable program including:

a first set of computer instructions for controlling the vacuum system to establish a base pressure in the chamber;

a second set of computer instructions for controlling the gas delivery system to introduce a process gas comprising TEOS and $O_3$ into the chamber;

a third set of computer instructions for controlling the vacuum system to increase the pressure in the chamber at a substantially constant rate from the base pressure to a target subatmospheric deposition pressure;

a fourth set of computer instructions for controlling the substrate heating system to supply thermal energy to react the TEOS and $O_3$ in the process gas without forming a plasma while the pressure is increasing to deposit a ramp silicon oxide layer over the substrate;

a fifth set of computer instructions for controlling the gas delivery system to terminate the flow of $O_3$ into the chamber a predetermined time after the pressure starts to increase;

a sixth set of computer instructions for controlling the vacuum system to maintain the pressure at the target deposition pressure when the pressure in the chamber becomes equal to the target deposition pressure;

a seventh set of computer instructions for controlling the gas delivery system to restart the flow of $O_3$ when the target deposition pressure is attained; and an eighth set of computer instructions for controlling the substrate heating system to supply thermal energy to react the process gas without forming a plasma while the pressure is equal to the target deposition pressure to form an SACVD layer over the ramp layer.

8. The system of claim 7 wherein the flow of $O_3$ is terminated when the pressure in the chamber is equal to about 100 torr.

9. The system of claim 7 wherein the target deposition pressure is maintained at about 450 torr.

10. The system of claim 7 wherein the second set of computer instructions controls the gas delivery system to vary the flow rate of the TEOS into the chamber.

11. A substrate processing system for depositing a film on a substrate, the system comprising:

a vacuum chamber;

a substrate heating system for supplying thermal energy to heat the substrate;

a gas delivery system configured to deliver a process gas to the vacuum chamber;

a vacuum system for adjusting the pressure in the vacuum chamber;

a system controller configured to control the gas delivery system, the substrate heating system, and the vacuum system; and a memory, coupled to the controller, comprising a computer-readable medium having a computer-readable program embodied therein for directing operation of the substrate processing system, the computer-readable program including:

a first set of computer instructions for controlling the vacuum system to establish a base pressure in the chamber;

a second set of computer instructions for controlling the gas delivery system to introduce a process gas comprising TEOS and $O_3$ into the chamber;

a third set of computer instructions for controlling the vacuum system to increase the pressure in the chamber at a substantially constant rate from the base pressure to a target subatmospheric deposition pressure;

a fourth set of computer instructions for controlling the substrate heating system to supply thermal energy to react the TEOS and $O_3$ in the process gas without forming a plasma while the pressure is increasing to deposit a ramp silicon oxide layer over the substrate;

a fifth set of computer instructions for controlling the vacuum system to maintain the pressure at the target deposition pressure when the pressure in the chamber becomes equal to the target deposition pressure; and a sixth set of computer instructions for controlling the substrate heating system to supply thermal energy to react the process gas without forming a plasma while the pressure is equal to the target deposition pressure to form an SACVD layer over the ramp layer.

12. The system of claim 11 wherein the target deposition pressure is maintained at about 450 torr.

13. The system of claim 11 wherein the second set of computer instructions controls the gas delivery system to vary the flow rate of the TEOS into the chamber.

14. The system of claim 11 wherein the substantially constant rate of increasing the pressure is between approximately 5 and 30 torr per second.

* * * * *